(12) United States Patent
Zeiger et al.

(10) Patent No.: US 9,102,285 B2
(45) Date of Patent: Aug. 11, 2015

(54) HOUSING ELECTRONIC COMPONENTS IN AUTOMOTIVE FUSES

(75) Inventors: David Zeiger, Mundelein (IL); Larry Hudson, Streamwood, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 175 days.

(21) Appl. No.: 13/205,251

(22) Filed: Aug. 8, 2011

(65) Prior Publication Data
US 2013/0039027 A1 Feb. 14, 2013

(51) Int. Cl.
| | |
|---|---|
| H02B 1/18 | (2006.01) |
| H02B 1/04 | (2006.01) |
| H02B 1/01 | (2006.01) |
| H05K 7/00 | (2006.01) |
| H05K 7/02 | (2006.01) |
| H05K 7/04 | (2006.01) |
| H01H 85/12 | (2006.01) |
| B60Q 1/00 | (2006.01) |
| B60R 16/023 | (2006.01) |
| H01H 85/30 | (2006.01) |
| H01H 85/32 | (2006.01) |
| B60L 1/00 | (2006.01) |
| B60T 7/20 | (2006.01) |
| B60R 16/027 | (2006.01) |
| H05K 7/06 | (2006.01) |
| H05K 7/20 | (2006.01) |
| H05K 13/04 | (2006.01) |
| G05B 11/01 | (2006.01) |
| B60R 25/10 | (2013.01) |
| H01R 13/66 | (2006.01) |
| H01H 85/20 | (2006.01) |

(52) U.S. Cl.
CPC .............. *B60R 16/0239* (2013.01); *B60L 1/00* (2013.01); *B60R 16/027* (2013.01); *B60T 7/20* (2013.01); *H01H 85/30* (2013.01); *H01H 85/32* (2013.01); *B60R 25/10* (2013.01); *G05B 11/01* (2013.01); *H01H 2085/208* (2013.01); *H01R 13/665* (2013.01); *H05K 7/02* (2013.01); *H05K 7/06* (2013.01); *H05K 7/20* (2013.01); *H05K 13/04* (2013.01); *Y10T 29/49117* (2015.01)

(58) Field of Classification Search
CPC .......... B60R 16/027; B60R 25/10; B60T 7/20; B60L 1/00; G05B 11/01; H01H 85/30; H01H 85/32; H05K 13/04
USPC .......... 361/807, 833, 834, 826, 828, 626, 630, 361/642, 646, 837, 728; 340/425.5, 638; 337/161, 158, 14; 439/620.27–620.34
See application file for complete search history.

(56) References Cited

U.S. PATENT DOCUMENTS

| | | | |
|---|---|---|---|
| 4,499,447 | A | 2/1985 | Greenberg |
| 6,525,654 | B1 * | 2/2003 | Siggers .................. 340/438 |

(Continued)

FOREIGN PATENT DOCUMENTS

DE 4024082 C1 1/1992

OTHER PUBLICATIONS

International Search Report and Written Opinion dated Oct. 25, 2012, from corresponding International Patent Application No. PCT/US2012/047203.

*Primary Examiner* — Courtney Smith
*Assistant Examiner* — Zhengfu Feng

(57) ABSTRACT

Systems methods for housing electronics in an automobile, the system comprising including a set of electronic components and a connector configured to be attached to the set of electronic components, the connector being configured to connect to an automotive fuse box.

11 Claims, 4 Drawing Sheets

(56) References Cited

U.S. PATENT DOCUMENTS 6,967,414 B1 * 11/2005 Wedding et al. ............... 307/9.1
2006/0023441 A1    2/2006 Wickett et al.
2008/0048819 A1 *  2/2008 Darr ............................... 337/206
2008/0231410 A1 *  9/2008 Doljack et al. ................. 337/206

* cited by examiner

HOUSING ELECTRONIC COMPONENTS IN AUTOMOTIVE FUSES

A. BACKGROUND

The invention relates generally to the field of housing electronics in an automobile.

B. SUMMARY

In one respect, disclosed is a method for housing electronics in an automobile, the method comprising providing a set of electronic components, and attaching a connector to the set of electronic components, the connector being configured to couple the set of electronic components to an automotive fuse box.

In another respect, disclosed is a system for housing electronics in an automobile, the system comprising set of electronic components, and a connector configured to be attached to the set of electronic components, the connector being configured to connect to an automotive fuse box.

Numerous additional embodiments are also possible.

C. BRIEF DESCRIPTION OF THE DRAWINGS

Other objects and advantages of the invention may become apparent upon reading the detailed description and upon reference to the accompanying drawings.

Figure 1:
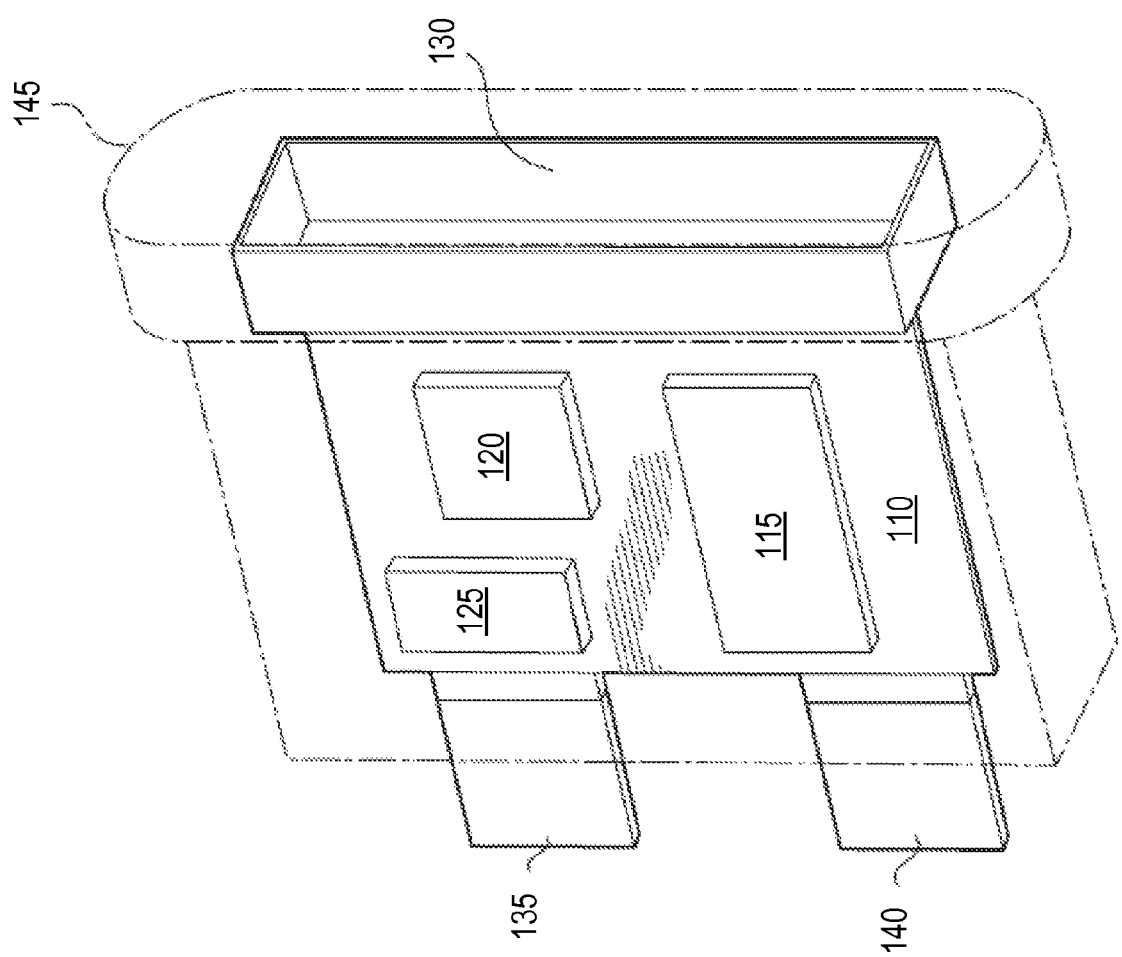
FIG. 1 is a block diagram illustrating an example of a set of electronic components housed in an automotive fuse housing, in accordance with some embodiments.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

D. DETAILED DESCRIPTION

One or more embodiments of the invention are described below. It should be noted that these and any other embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art.

Those of skill will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

FIG. 1 is a block diagram illustrating an example of a set of electronic components housed in an automotive fuse housing, in accordance with some embodiments.

Device 110 illustrates an example of a set of electronic components being housed in an automotive fuse housing. In this example, electronic components 115, 120, & 125 are being housed in housing 130. Housing 130 is configured to be coupled to electrical connectors 135 and 140, which, in some embodiments, are configured to couple device 110 to an automotive fuse box. In some embodiments, the coupling between device 110 and an automotive fuse box may be physical (for support), and/or electrical (for power and data), etc. In some embodiments, housing 130 may be contained in external housing 145. In some embodiments, external housing 145 may be configured as a standard automotive fuse.

In some embodiments, the electronic components in device 110 may be configured to receive power from the automotive fuse box though electrical connectors 135 and 140. In alternative embodiments, power to device 110 may be provided by an external source. In yet other embodiments, the electronic device may not require power to operate.

In some embodiments, device 110 may be configured to communicate with external devices wirelessly. Device 110 may be configured to communicate with another device in the vehicle or with another device outside of the vehicle. In alternative embodiments, device 110 may be configured to communicate with an external device through electrical connectors 135 and 140. Electrical connectors 135 and 140 may be coupled to a data bus extending through the automobile, the data bus being also coupled to the external device. In some embodiments, device 110 may be configured to couple to connectors other than electrical connectors 135 and 140. In some embodiments, device 110 may be configured to receive both power and data through electrical connectors 135 and 140, and accordingly, the bus may be configured to carry both power and data.

In some embodiments, device 110 is configured to replicate the functionality of a traditional fuse in addition to performing any additional functionality that device 110 may have. For example, device 110 may be configured to monitor current flowing through device 110 and to open the circuit when the current exceeds a threshold value. This "fuse" functionality may be implemented using electronic components or, in alternative embodiments, device 110 may incorporate a traditional fuse circuit to perform the fuse functionality in addition to comprising the additional electronic components for implementing the additional functionality.

In some embodiments, device 110 may be used as "computer key". In some embodiments, power to one or more external functions may be controlled by device 110. In some embodiments, the device may be configured to selectively permit the flow of power through the device in response to one or more conditions. For example, device 110 may be configured to allow power in response to receiving an "on" command from a wireless controller and to not allow power in response to receiving an "off" command from a wireless controller. In alternative embodiments, device 110 may be configured to not allow power delivery in response to receiving an appropriate signal from one or more antitheft device (pressure sensor, motion sensor, etc.)—indicating, for example, an unauthorized attempt to operate the vehicle.

In some embodiments, device 110 and housing 145 may be configured to be removable from the automotive fuse box.

Figure 2:
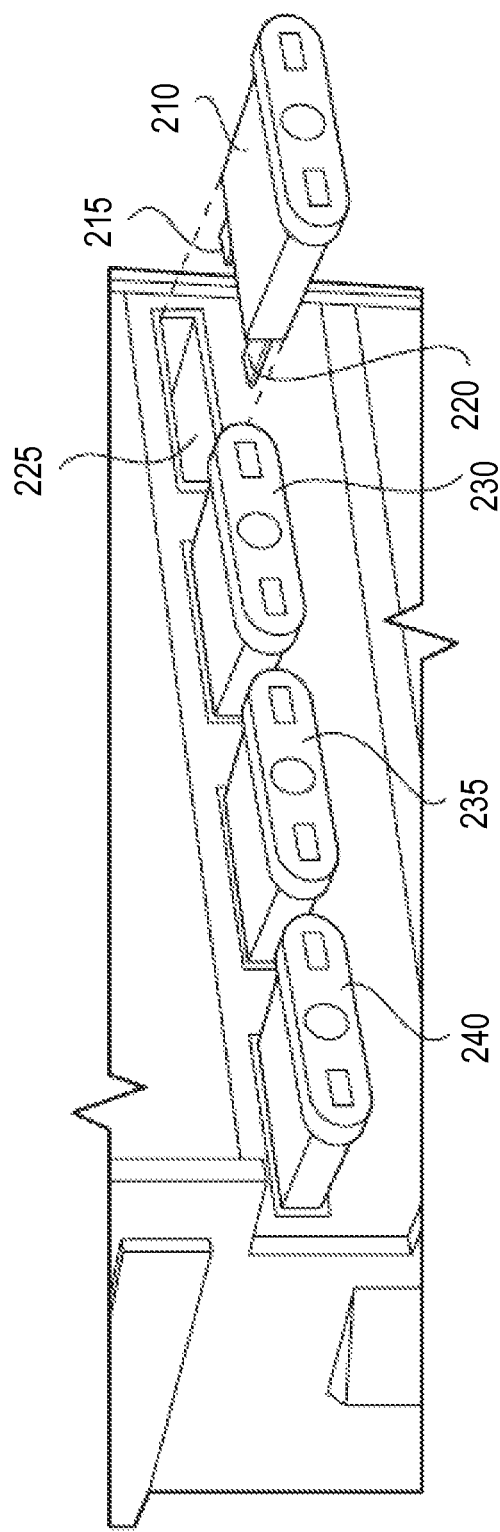
FIG. 2 is a block diagram illustrating an example of a set of electronics components housed in an automotive fuse housing connected to an automobile fuse box, in accordance with some embodiments.

FIG. 2 is a block diagram illustrating an example of a set of electronics components housed in an automotive fuse housing connected to an automobile fuse box, in accordance with some embodiments.

In some embodiments, fuse 210 is configured to house a device comprising of one or more electronic components. The device inside fuse 210, in some embodiments, may be configured to have functionality that is similar to the functionality of device 110. Fuse 210 may be configured to couple to the fuse box using electrical connectors 215 and 220. Fuse 210 may be configured to be inserted into empty fuse slot 225.

In some embodiments, the fuse box may be configured to host additional fuses, such as fuse 230, 235, and 240. In some embodiments, additional fuses 230, 235, and 240 may standard fuses or the additional fuses may be fuses comprising active electronics similar to fuse 210.

Figure 3:
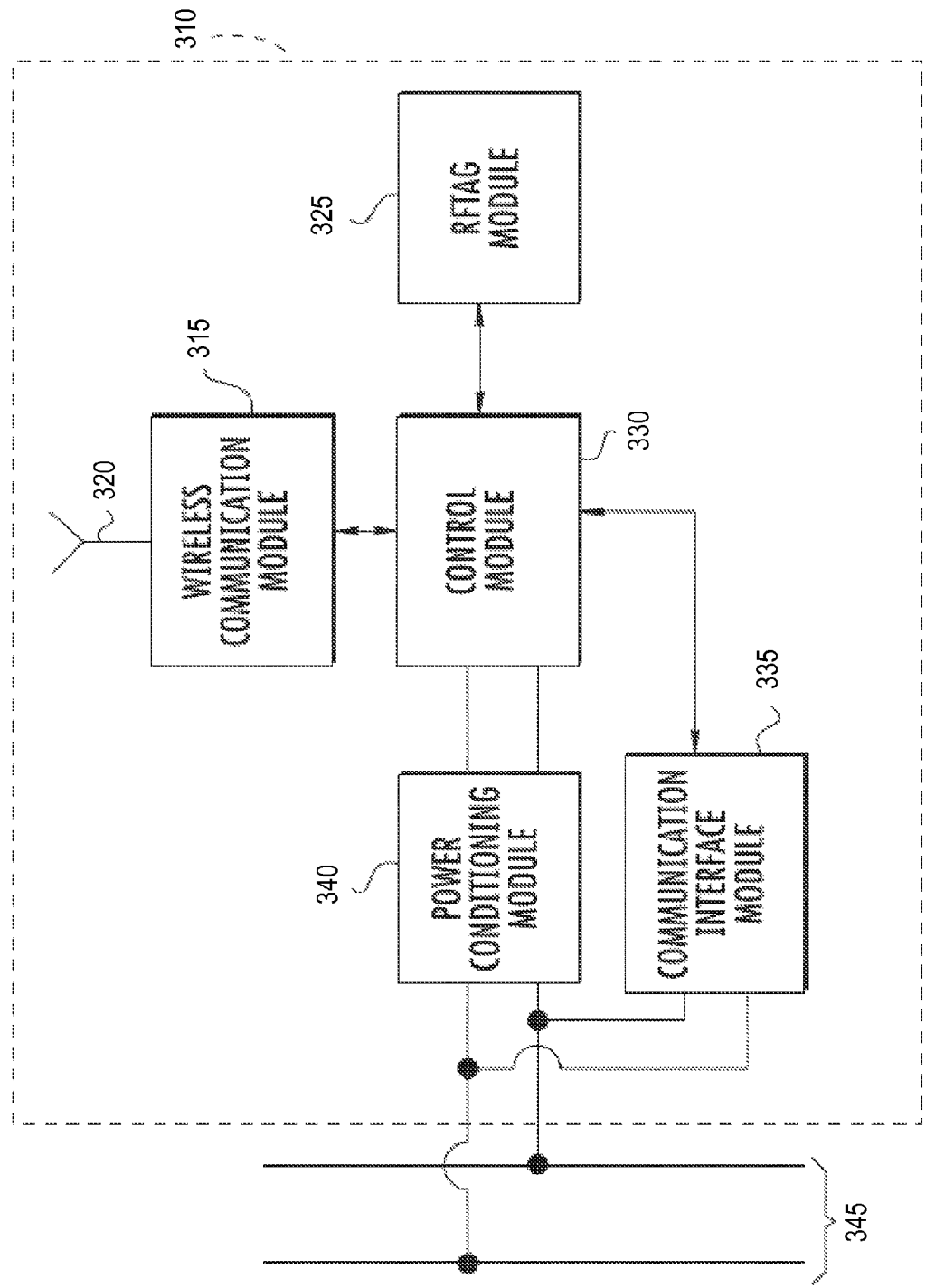
FIG. 3 is block diagram illustrating an alternative example of a set of electronic components housed in an automotive fuse housing, in accordance with some embodiments.

FIG. 3 is block diagram illustrating an alternative example of a set of electronic components housed in an automotive fuse housing, in accordance with some embodiments.

In some embodiments, device 310 is configured to be housed within an automotive fuse. In some embodiments, device 310 may be configured with functionality that is similar to the functionality of device 110 and device 210.

In this example, device 310 is configured to couple to a fuse box comprising one or more fuses through buses 345. In some embodiments, device 310 is configured to receive power and/or communication data through buses 345.

Control module 330 is configured to provide the main control in implementing the functionality of device 310. In some embodiments, control module 330 is coupled to power conditioning module 340, which is configured to couple device 310 to power buses 345 and to ensure that clean power is delivered to device 310.

Control module 330 is also configured to be coupled to communication interface module 335, which is configured to communicate data to and from external devices over buses 345.

Control module 330 is also configured to be coupled to wireless communication module 315, which is configured to communicate wirelessly with one or more external devices through antenna 320.

Control module 330 is also configured to be coupled to RFTag module 325, which is configured to establish near-field communications with one or more external devices that have compatible communication equipment. In some embodiments, multiple windings may be used on the FGTag in order to reduce size to ensure that the RFTag fits into the housing for device 310.

Figure 4:
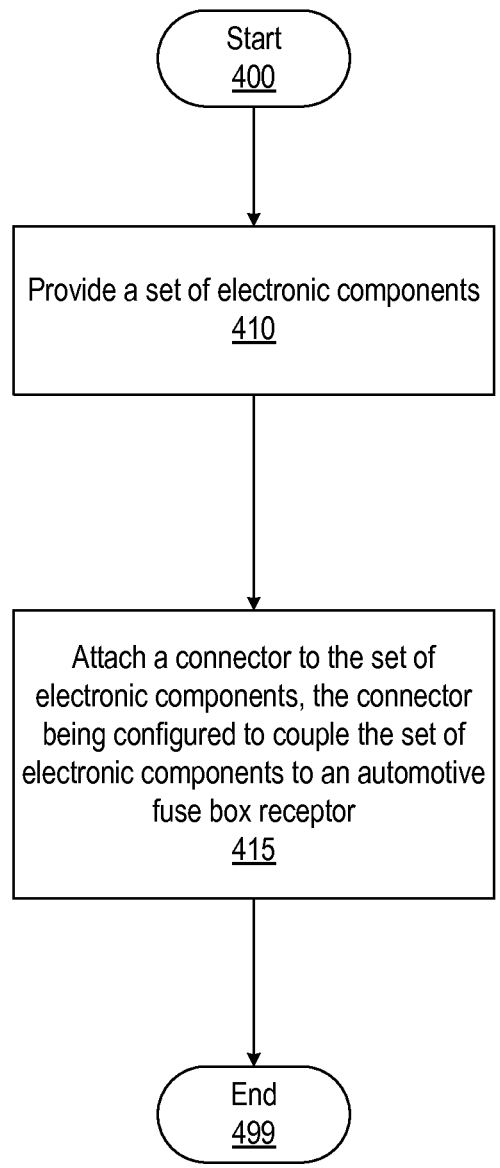
FIG. 4 is a flow diagram illustrating a method for housing a set of electronic components in an automotive fuse housing, in accordance with some embodiments.

In other embodiments, device 310 may comprise a variety of other electronic components having a variety of additional functionalities. Examples of such devices may include:

- Devices that are configured to communicate using the Bluetooth or Wi-Fi protocols according to one or more Bluetooth or Wi-Fi communication profiles
- FM modulators that are configured to receive an audio signal from an external device and transmit the signal to an automotive car audio system though the FM radio
- Computer controlled keys for cars where the devices are configured to restrict entry and/or the car's engine though the devices
- Specialized RFTags that can communicate with tollbooths and provide power
- SVT systems, mini GPS or "lojack" style broadcast units
- Gas purchasing systems embedded with appropriate RFTags
- Miniature cell phone communication devices for voice, data, and/or video FIG. 4 is a flow diagram illustrating a method for housing a set of electronic components in an automotive fuse housing, in accordance with some embodiments.

In some embodiments, the method described here may be performed by one or more of the systems shown in FIGS. 1-3.

Processing begins at 400 where, at block 410, a set of electronic components is provided.

At block 415, a connector is attached to the set of electronic components, the connector being configured to couple the set of electronic components to an automotive fuse box.

Processing subsequently ends at 499.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method for housing electronics in a fuse housing for use with a vehicle, the fuse housing having first and second electrical connectors, which extend outwardly from the housing, carry power and data, and which are inserted into a fuse box in the vehicle, the method comprising:
    providing a set of electronic components inside the fuse housing and which are electrically coupled to the first and second electrical connectors that comprise a vehicle bus, the electronic components of the provided set comprising:
    a control module;
    a wireless communications module coupled to the control module and having an antenna;
    an RF tag module coupled to the control module;

a power conditioning module coupled to the control module and to the vehicle bus and providing clean power to components in the fuse housing; and a communications interface module coupled to both the vehicle bus and the control module, the electronic components selectively allowing and disallowing the flow of current through the first and second connectors, responsive to "on" and "off" commands received by the wireless communications module inside the fuse housing and that are received from a wireless controller that is external to the fuse housing and external to the vehicle;

connecting the first and second electrical connectors to the vehicle bus, which extends through the vehicle, said vehicle bus being operatively coupled to the wireless controller that is external to the vehicle.

2. The method of claim 1, wherein the set of electronic components is additionally able to turn off and turn on a current flowing through the first and second connectors via a fuse housing connector operatively connected to the fuse box.

3. The method of claim 1, where the set of electronic components is additionally able to switch off a current flowing through the set of electronic components in response to the current exceeding a threshold value, the method further comprising the step of switching off current when said current exceeds said threshold value.

4. A system for housing electronics in an automobile fuse housing that is in an automobile, the system comprising:

a fuse housing that fits into the automobile fuse housing, the fuse housing having first and second electrical connectors that extend outwardly from the fuse housing and which are electrically connected into the automobile fuse housing;

a set of electronic components inside the fuse housing, the set of electronic components inside the fuse housing comprising:

a control module;

a wireless communication module coupled to the control module and that communicates wirelessly with devices through an antenna;

a power conditioning module coupled to a vehicle bus and the control module, the power conditioning module providing clean power to components inside the fuse housing;

a communications interface module coupled between the vehicle bus and the control module, the communications interface module communicating over the vehicle bus; and an RF tag module coupled to the control module, the RF tag module establishing near-field communications with devices external to the fuse housing; and a vehicle bus that extends through the automobile and which is coupled to the power conditioning module and the communication interface module via first and second electrical connectors, the bus communicating data to and from devices external to the automobile;

wherein the set of electronic components allow and disallow the flow of current through the first and second connectors responsive to "on" and "off" commands received by the wireless communications module from a wireless controller that is external to the automobile fuse housing and which is external to the automobile.

5. The system of claim 4, where the set of electronic components receives power from the fuse box via the first and second electrical connectors.

6. The system of claim 4, where the set of electronic components communicates with an external device wirelessly.

7. The system of claim 4, where the set of electronic components communicates with an external device through one or more fuse box wires via the connector.

8. The system of claim 4, where the set of electronic components turns off and turns on a current flowing through the set of electronics via the connector from the fuse box responsive to receipt of commands that are received from outside the automobile.

9. The system of claim 4, where the set of electronic components switches off a current flowing through the set of electronics through the connector and the fuse box in response to the current exceeding a threshold value.

10. The system of claim 4, where the set of electronic components is housed in a package in the form of an automotive fuse.

11. The system of claim 4, where the connector is removable from the automotive fuse box.

* * * * *